(12) United States Patent
Nakatou

(10) Patent No.: US 6,745,783 B2
(45) Date of Patent: Jun. 8, 2004

(54) CLEANING PROCESSING METHOD AND CLEANING PROCESSING APPARATUS

(75) Inventor: Isamu Nakatou, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 09/918,073

(22) Filed: Jul. 30, 2001

(65) Prior Publication Data

US 2002/0036002 A1 Mar. 28, 2002

(30) Foreign Application Priority Data

Aug. 1, 2000 (JP) ........................................ 2000-233493

(51) Int. Cl.$^7$ ................................................ B08B 3/02
(52) U.S. Cl. ................... 134/56 R; 134/58 R; 134/61; 134/66; 134/94.1; 134/99.1; 134/103.1; 134/902
(58) Field of Search .............................. 134/56 R, 57 R, 134/58 R, 61, 66, 94.1, 99.1, 103.2, 902, 25.4

(56) References Cited

U.S. PATENT DOCUMENTS

| | | | | |
|---|---|---|---|---|
| 4,830,888 A | * | 5/1989 | Kobayashi et al. | 427/430.1 |
| 5,168,886 A | * | 12/1992 | Thompson et al. | |
| 5,915,396 A | * | 6/1999 | Kinose | |
| 5,964,954 A | * | 10/1999 | Matsukawa et al. | |
| 6,007,675 A | * | 12/1999 | Toshima | |
| 6,014,817 A | * | 1/2000 | Thompson et al. | |
| 6,035,871 A | * | 3/2000 | Eui-Yeol | 134/61 |
| 6,074,443 A | * | 6/2000 | Venkatesh et al. | 29/25.01 |
| 6,122,566 A | * | 9/2000 | Nguyen et al. | 700/218 |
| 6,176,667 B1 | * | 1/2001 | Fairbairn et al. | |
| 6,224,638 B1 | * | 5/2001 | Jevtic et al. | 29/25.01 |
| 6,275,744 B1 | * | 8/2001 | Yoshida | 700/218 |
| 6,336,204 B1 | * | 1/2002 | Jevtic | 716/1 |
| 6,351,686 B1 | * | 2/2002 | Iwasaki et al. | 700/228 |
| 6,360,132 B2 | * | 3/2002 | Lin et al. | |
| 6,490,810 B2 | * | 12/2002 | Kato et al. | |
| 6,519,498 B1 | * | 2/2003 | Jevtic et al. | 700/101 |

FOREIGN PATENT DOCUMENTS

JP           2000-58615    *  2/2000

OTHER PUBLICATIONS

European Patent Office 330,836 Sep. 1989.*

* cited by examiner

*Primary Examiner*—Frankie L. Stinson
(74) *Attorney, Agent, or Firm*—Morrison & Foerster LLP

(57) ABSTRACT

To provide a cleaning processing method and a cleaning processing apparatus which can improve cleaning efficiency.

The apparatus is structured to install processing units 11a–11d which provide more than one kind of chemical liquids out of a plurality of chemical liquids A–C for processing wafers W, and to enable the same kind of a processing liquid to be provided for at least two processing units, and, upon successively processing objects-to-be-processed which require their own processing sequences, to consecutively load each object-to-be-processed W to a processing unit which stores designated chemical liquid for a processing sequence of the object-to-be-processed.

5 Claims, 5 Drawing Sheets

|  | Manual | ⇒ | Auto |  |  |
|---|---|---|---|---|---|
|  | sc1(1) | sc1(2) | QDR | sc2 | ... |
|  | • | • | • | • |  |
|  | • | • | • | • |  |
|  | • | • | • | • |  |
|  | • | • | • | • |  |
|  | • | • | • | • |  |
|  | • | • | • | • |  |
|  | • | • | • | • |  |
|  | • | • | • | • |  |
|  | • | • | • | • |  |
| Disable | No | Yes | No | No | ... |

F I G. 5

CLEANING PROCESSING METHOD AND CLEANING PROCESSING APPARATUS

REFERENCE TO RELATED APPLICATIONS

The subject application is related to subject matter disclosed in Japanese Patent Application No. 2000-233493 filed on Aug. 1, 2000 in Japan to which the subject application claims priority under Paris Convention and which is incorporated herein by reference.

BACKGROUND OF THE INVENTION

1. Field of the Invention

This invention relates to a cleaning processing method and a cleaning processing apparatus for processing objects-to-be-processed, e.g. semiconductor wafers, glass substrates for LCD's, etc., with chemical liquids and cleaning liquids.

2. Related Background Art

In cleaning processing methods and cleaning processing systems, this kind, objects-to-be-processed, such as glass substrates for LCD's, semiconductor wafers, etc. (hereinafter referred to as "wafers"), are processed for cleaning off the contaminants staying thereon with processing liquids containing various kinds of chemical liquids and rinsing liquids (cleaning liquids).

The contaminants on the surfaces of wafers include, for example, particles, metals, organic matters, oxide films, etc. Chemical liquids vary depending on kinds of the contaminants, and include a mixed liquid of ammonium hydroxide diluted with pure water and hydro-peroxide ($NH_4OH/H_2O_2/H_2O$), a mixed liquid of dilute hydrochloric acid diluted with pure water and hydro-peroxide ($HCl/H_2O_2/H_2O$), hydro-fluoric acid diluted with pure water ($HF/H_2O$), etc. Also, the rinsing liquids are used mainly to rinse off the chemical liquids staying on the wafers and include pure water, ozone water, etc.

Then, the wafers are immersed one after another into processing tanks containing the chemical liquids etc. to have the contaminants removed and rinsed with the chemical liquids. However, the wafers successively conveyed to the cleaning processing system vary in the kind of the contaminants. Therefore, it is necessary to install a plurality of processing tanks respectively containing different chemical liquids so that each wafer could be immersed into a designated processing tank.

However, in the conventional cleaning processing method and cleaning processing system, there is a disadvantage that, while a preceding wafer is being processed with a chemical liquid in a certain processing tank, the following wafer, requiring the processing with the same chemical liquid must wait until the cleaning of the preceding wafer, being firstly processed, is completed. Under the situation, it results in lack of cleaning efficiency.

SUMMERY OF THE INVENTION

The present invention has been made in view of the above-described situation, and an object of the present invention is to provide a cleaning processing method and a cleaning processing apparatus that can improve cleaning processing efficiency.

In order to achieve the above-described object, the cleaning processing method according to the present invention is characterized by:

installing a plurality of processing units for processing at least one object-to-be-processed with a plurality of kinds of processing liquids, and enabling the same kind of a processing liquid to be supplied to at least two processing units of the plurality of the processing units;

upon making processing by successively introducing objects-to-be-processed each of which has its own processing sequence into a plurality of processing units, choosing one or more of the processing units into which an object to be firstly processed is carried, by checking a processing sequence of an object to be processed afterwards so as to shorten a whole processing time of the objects-to-be-processed being judged.

Also, the cleaning processing apparatus according to the present invention comprises:

a plurality of processing units for processing an object-to-be-processed with a plurality of kinds of processing liquids, the same kind of a processing liquid being capable of being supplied to at least two of the plurality of processing units;

a controller for, upon successively introducing objects-to-be-processed each having its own processing sequence into a plurality of processing units, checking the processing sequence of the object to be processed afterwards to choose one or more of the plurality of the processing units into which an object to be firstly processed is carried so that a whole processing time of the objects-to-be-processed being judged can be shortened.

According to the present invention structured as described above, the first processing unit which can provide a processing liquid A and the third processing unit which can provide the processing liquid A and a processing liquid B can be installed for example, since a plurality of kinds of processing liquids can be provided for each processing unit and the same kind of processing liquid can be provided for at least two processing units. Consequently, in a case of consecutively conveying two objects-to-be-processed of a processing sequences to be processed with the processing liquid A, the object to be firstly processed can be processed by the first processing unit, and the object to be processed afterwards can be successively processed by the third processing unit. That is to say, there is no wasting time by staying in the line even in a case of consecutively processing two objects-to-be-processed of the same processing sequence.

Likewise, by setting the same processing liquid for three or more processing units, even if three or more objects-to-be-processed of the same processing sequence are consecutively conveyed, those objects-to-be-processed can be successively processed. However, even when the same processing liquid is set in two processing units, a time during which the third object-to-be-processed stays in the line can be shortened enough since the processing of the first object-to-be-processed would have been far progressed by the time the third object-to-be-processed is to be processed. Accordingly, cleaning efficiency of objects-to-be-processed can be improved.

Moreover, according to the present invention, when making processing by successively loading objects-to-be-processed into a plurality of processing units wherein each of the object-to-be-processed requires its own processing sequence, a processing unit is chosen for the object-to-be-processed which is to be firstly processed to be conveyed into by checking the processing sequence of the object-to-be-processed which is to be processed afterwards so as to shorten the whole processing time of the objects-to-be-processed. According to the present invention, a processing unit for an object-to-be-processed to be firstly processed in can be chosen in consideration of processing sequences of objects to be processed afterwards so as to shorten a whole processing time of the objects-to-be-processed being judged (two or more groups of objects-to-be-processed to be decided for their processing units); in other words, economic conditions, complicated handling, simplicity of processing, etc. are considered, and under those conditions, a processing unit for an object to be firstly processed can be chosen to make a whole processing time as short as possible.

BRIEF DESCRIPTION OF THE DRAWINGS

FIG. 5 is a view explaining another example of the cleaning processing apparatus.

DESCRIPTION OF THE PREFERRED EMBODIMENTS

Embodiments of the present invention will be described below in detail with reference to the attached drawings. In the embodiments, the cleaning processing apparatus according to the present invention will be explained by means of a case that the cleaning processing apparatus is applied to a cleaning processing system for semiconductor wafers.

(1) A First Embodiment

Figure 1:
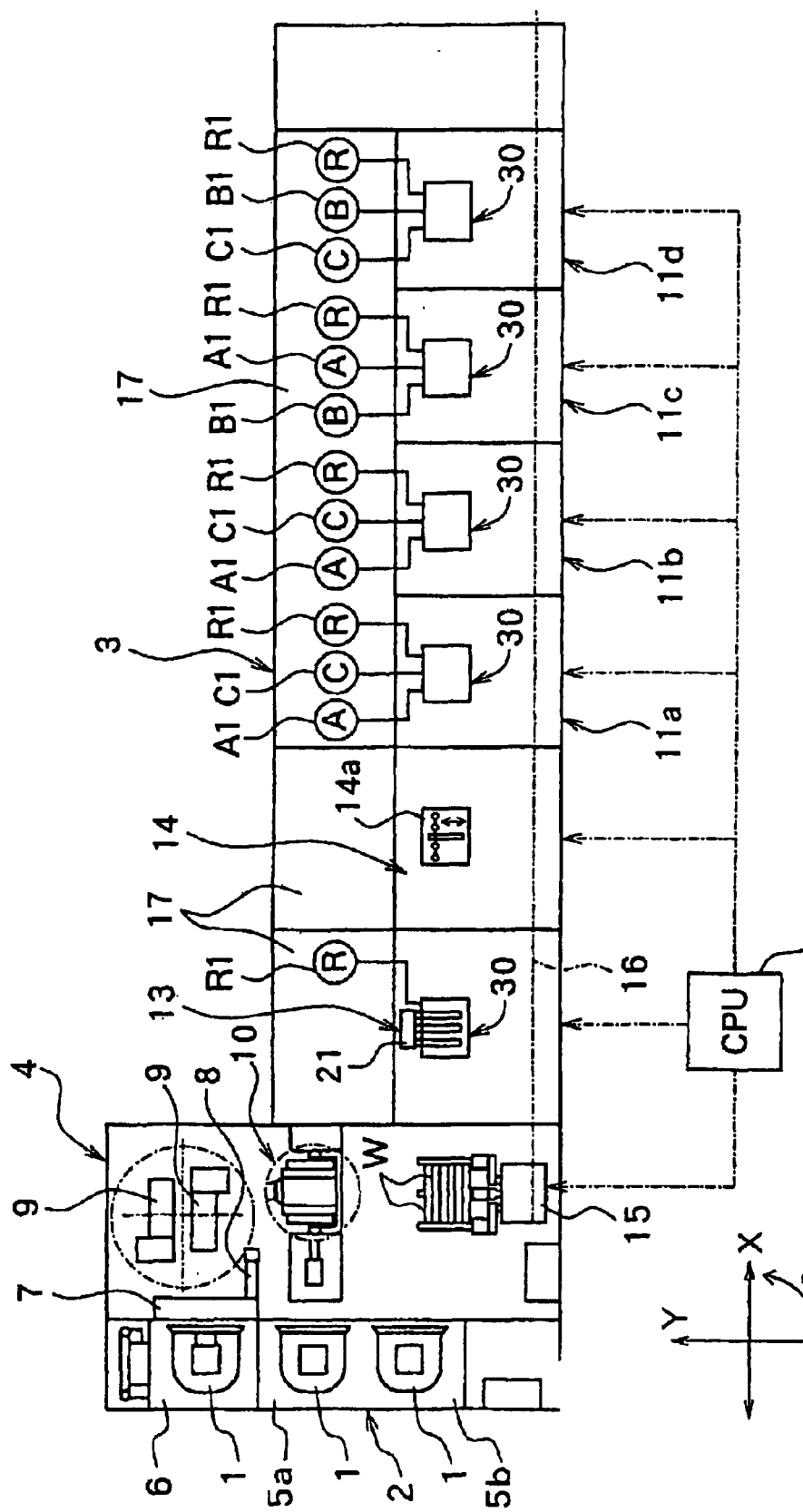
FIG. 1 is a diagrammatic plane view of a cleaning processing system using the cleaning processing apparatus according to a first embodiment of the present invention.
Figure 2:
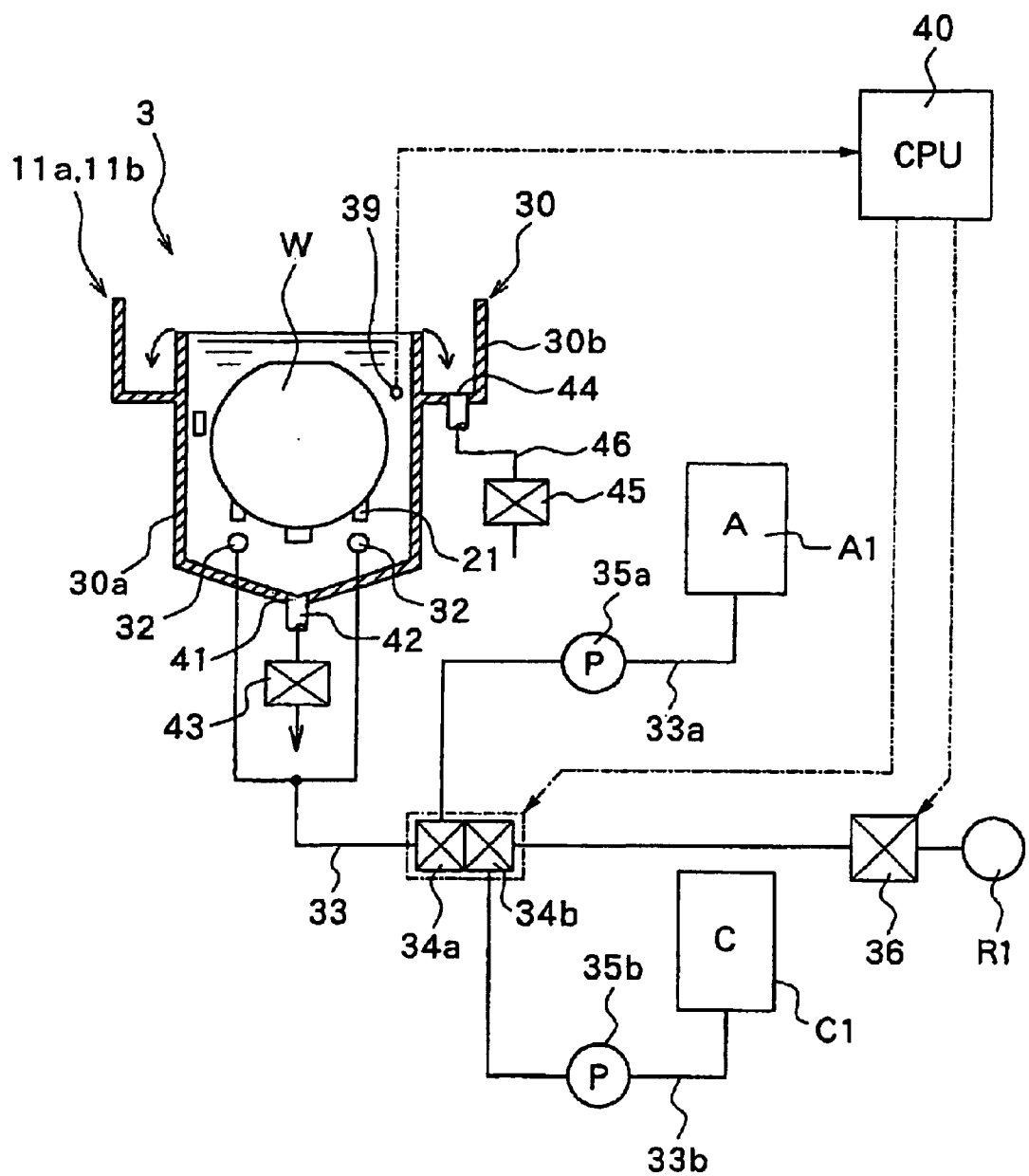
FIG. 2 is a diagrammatic sectional view of the cleaning processing apparatus.

First of all, as shown in FIGS. 1 and 2, a first embodiment of the present invention will be explained with reference to FIGS. 1 and 2. The cleaning processing apparatus 3 according to the first embodiment comprises four (plural) processing units 11a–11d loaded with a plurality of kinds (two in the present embodiment) of chemical liquids of a plurality of kinds (three in the present embodiment as A–C) of chemical liquids (processing liquids) for processing a plurality of sheets (e.g., 50 sheets in two carriers) of semiconductor wafers W (hereinafter referred to as "wafers W") as objects-to-be-processed, wherein the same kind of a chemical liquid can be loaded in at least two processing units. As the chemical liquids A–C, the chemical liquids described in the background art are used. In order to successively process the wafers W of various kinds of processing recipes (processing sequences), a CPU 40 is installed as controlling means, or a controller, for controlling each wafer W to be consecutively conveyed to the processing units 11a–11d loaded with the designated chemical liquids and a rinsing liquid.

The CPU 40 controls loading and unloading of the wafers W into and out of each processing unit 11a–11d by controlling a wafer conveyer chuck 15 etc. which will be described later. Furthermore, the CPU 40 chooses a processing unit for processing a preceding wafer W by comparing a processing recipe of the preceding wafer W, which is to be firstly processed, with a processing recipe of each of the following wafers W, which are to be processed subsequently, so as to shorten a whole processing time as short as possible.

For example, to process the following wafers W successively after the preceding wafer W without waiting in the line, Group A of processing units (processing tanks) is chosen according to the processing sequence of the preceding wafer W not to overlap with Group B of processing units chosen according to the processing sequence of the following wafer W. Otherwise, Group B of the following wafer W can be chosen firstly, and Group A for the preceding wafer W can be chosen afterwards. In this way, once processing units (processing tanks) are chosen, the preceding wafer W is conveyed to the first processing tank of Group A, and then the following wafer W are conveyed to the first processing tank of Group B. Then processing is made in accordance with the respective processing sequences.

Not only the processing sequences but processing time also can be considered. For example, unless one processing unit is used at the same time, the same processing unit can be chosen in a part of a processing sequence. In other words, as long as the preceding wafer W is not conveyed to the processing unit of Group B during the following wafer W is still in said processing unit, said processing unit can be chosen to be included in Group A. By thus considering processing time as well, greater extent of choice of the processing units is provided.

The above-described processing units are selected before the preceding wafer W is conveyed, i.e., before the preceding wafer W starts to be transferred inside the cleaning processing apparatus 3.

Each processing unit 11a–11d comprises a rinse tank (not shown) to wash off (rinse) the chemical liquids staying on the wafers W after liquid-processing. In each processing unit 11a–11d, the chemical liquids are replaceable in one processing tank 30, i.e., a chemical liquid A can be replaced by a chemical liquid B in the processing units 11a and 11b, the chemical liquid A can be replaced by the chemical liquid B in the processing unit 11C and the chemical liquid B can be replaced by a chemical liquid C in the processing unit 11d.

The above-described constitution will be described more in detail with reference to the cleaning processing system as a whole.

The cleaning processing system mainly comprises an entrance/exit 2 for loading and unloading containers, e.g. carriers 1, which hold wafers W horizontally; the cleaning processing apparatus 3 which makes processing on the wafers W with chemical liquids, rinsing liquids, etc., and dries the wafers W; and an interface 4 which is positioned between the entrance/exit 2 and the cleaning apparatus 3 and transfers the wafers W, adjusts alignment, changes bearing, etc.

The above-described entrance/exit 2 has both a carrier-loading part 5a and a carrier-unloading part 5b, and a wafer transfer part 6 on one side of the cleaning processing system. In this case, a conveyance mechanism, not shown, is disposed between the carrier-loading part 5a and the wafer transfer part 6. The conveyance mechanism conveys the carriers 1 from the carrier-loading part 5a to the wafer transfer part 6.

Moreover, carrier lifters (not shown) are disposed respectively in the carrier-unloading part 5b and the wafer transfer part 6. The carrier lifters deliver empty carriers 1 to and from a carrier stand-by part (not shown) disposed above the entrance/exit 2. In this case, a carrier delivery robot (not shown) is installed at the carrier stand-by part and can shift horizontally (in X and Y direction) and vertically (in Z direction). The carrier delivery robot aligns the empty carriers 1 conveyed from the wafer transfer part 6 and can deliver the empty carriers 1 to the carrier-unloading part 5b. Also, not only the empty carriers but also the carriers 1 holding the wafers W, having processing sequences set up, stand by at the carrier stand-by part.

The above-described wafer transfer part 6 is opened in the above-described interface 4, and a lid switch 7 is disposed in the opening. The shield (not shown) of a carrier 1 is opened or closed by the lid switch 7. Thus, the lid of a carrier 1 holding wafers W to be processed, which has been conveyed to the wafer transfer part 6, can be opened by the lid switch 7 so as to enable the wafers W inside the carrier 1 to be unloaded, and after the wafers W are all unloaded, the lid can be closed as it was by the lid switch 7. Also, a lid of an emptied carrier 1 conveyed from the carrier stand-by part to the wafer transfer part 6 can be opened by the lid switch 7 so as to enable the wafers W to be loaded into the carrier 1, and after the wafers W are all loaded, the lid can be closed as it was by the lid switch 7. Furthermore, a mapping sensor 8 is installed near the opening of the wafer transfer part 6 and detects a number of sheets of wafers W which are held inside the carrier 1.

The interface 4 comprises: horizontal-carrying means, e.g., a wafer-carrying arm 9, which holds a plurality of wafers W, 25 sheets for example, in the horizontal position and transfers the wafers W between the wafer transfer part 6 and a carrier 1; a pitch changer, not shown, which keeps a plurality of wafers W, 50 sheets for example, in the vertical position at a prescribed interval; a bearing changing means, e.g., a bearing changer 10, which is disposed between the wafer-carrying arm 9 and the pitch changer and changes the bearings of a plurality of wafers W, 25 sheets for example, between the horizontal or the vertical position; and position detecting means, e.g., a notch aligner (not shown), which detects notches (not shown) in the wafers W whose bearings has been changed to the vertical bearing. Furthermore, the interface 4 comprises a conveying passage 16 which is in communication with the cleaning processing apparatus 3, and this conveying passage 16 comprises wafer-carrying means, e.g., a wafer conveyer chuck 15 which can be freely shifted.

On the other hand, the above-described cleaning processing apparatus 3 comprises: processing units 11a–11d which clean off the contaminants such as particles, organic matters, etc. staying on wafers W; a rinse-and-dry processing unit 13 which processes the wafers W by washing off the chemical liquids staying thereon and drying; and a chuck cleaning unit 14, each of which is arranged in a rectangular section next to each other on a straight line. On the front side of the respective units 11a–11d, the conveying passage 16 is provided to continuously connect the units. The wafer conveyer chuck 15 is disposed in the conveying passage 16 and can be shifted in the X and the Y directions (a horizontal direction), in the Z direction (a vertical direction) and in the E direction (a rotational direction). Also, on the side of each unit 11a–11d, 13 and 14, opposite to the conveying passage 16, there is a storage 17 which stores a plurality of chemical liquid tanks A1, B1 and C1 containing chemical liquids A–C; a source of pure water R1 as a rinsing liquid R, and piping and instruments; and a wafer boat 21 which holds wafers W and can be moved up and down in the Z direction (the vertical direction) (FIG. 1 shows the wafer boat 21 disposed in the rinse-and-dry processing unit 13).

The first and the second processing units 11a and 11b each mainly comprise a processing tank 30, and chemical liquid tanks A1 and C1 which store and supply a chemical liquid A or a chemical liquid C to the processing tank 30. Likewise, the third processing unit 11c comprises a processing tank 30, and chemical liquid tanks B1 and A1 which store and supply a chemical liquid B or a chemical liquid A to the processing tank 30. The fourth processing unit 11d comprises a processing tank 30, chemical liquid tanks C1 and B1 which store and supply a chemical liquid C or a chemical liquid B respectively to the processing tank 30. Also, the rinse-and-dry processing unit 13 comprises a processing tank 30, a pure water source R1 which supplies a rinsing liquid R to the processing tank 30, and drying means (not shown) which dries the rinsing liquid staying on wafers W.

Furthermore, the chuck cleaning unit 14 is furnished with a nozzle 14a which is shifted back and forth in the Y direction and jets pure water and drying gas (e.g. $N^2$ gas). The nozzle 14a cleans and dries the wafer conveyer chuck 15.

FIG. 2 details the first and the second processing unit 11a, 11b of the cleaning processing apparatus 3. This first and the second processing units 11a, 11b store a chemical liquid A or a chemical liquid C, and each comprises a processing unit 30 which cleans off the contaminants, such as particles etc., on the surfaces of wafers W by immersing the wafers W into a chemical liquid A or a chemical liquid C; means for supplying a cleaning liquid, e.g., a cleaning liquid supplying nozzle 32 which is installed inside the processing tank 30 and supplies the chemical liquid A or the chemical liquid C to the processing tank 30; a main supply pipe 33 connecting the cleaning liquid supplying nozzle 32 to the pure water source R1 through a flow-rate controllable on-off valve 36 (hereinafter referred to as a flow rate control valve 36); a first branch pipe 33a interconnecting a first change-over on-off valve 34a, the main supplying pipe 33 for opening/closing and change-over thereof and the chemical liquid tank A1; a second branch pipe 33b interconnecting a second change-over on-off valve 34b inserted in the main supply pipe 33 for opening/closing and change-over thereof and the chemical liquid tank C1; a first pump 35a disposed in the first branch pipe 33a; and a second pump 35b disposed in the second branch pipe 33b.

The first pump 35a forcedly supplies a chemical liquid A in the chemical liquid tank A1 into an inner tank 30a of the processing tank 30, which is to be described later, through the first change-over on-off valve 34a, the main supply pipe 33 and the cleaning liquid supply nozzle 32. As a substitute for the first pump 35a, nitrogen ($N_2$) gas, for example, can be supplied into the tank A1 to thereby force out the chemical liquid A into the processing tank 30 under a pressure of the $N_2$ gas. The second pump 35b forcedly supplies the chemical liquid C into the inner tank 30a through the second change-over on-off valve 34b. The change-over on-off valve 34a and 34b also can forcedly disconnect the main supply pipe 33 from the first branch pipe 33a and the second branch pipe 33b and can be switched to connect the main supply pipe 33 to the first branch pipe 33a or connect the main supply pipe 33 to the second branch pipe 33b. Moreover, the change-over on-off valve 34a and 34b and the flow control valve 36 can be controlled by the CPU 40.

Furthermore, a temperature sensor 39 is installed in the processing tank 30 as means for detecting a temperature of a chemical liquid A or a chemical liquid C stored in the inner tank 30. A detecting signal from the temperature sensor 39 is outputted to the CPU 40.

Also, a means for opening and closing, e.g., an on-off valve 43 is inserted in a waste fluid pipe 42 connected to a drain port 41 formed in the bottom of the inner tank 30a.

Moreover, the processing tank 30 comprises an inner tank 30a which stores a chemical liquid, and an outer tank 30b which covers the outside of an edge portion of the opening of the inner tank 30a. A drain pipe 46 is connected with a drain port 44 formed in the bottom of the outer tank 30b by an on-off valve 45. Besides, the wafer boat 21 is installed inside the inner tank 30a and can be shifted up and down. This wafer boat 21 carries a plurality of wafers W, e.g., 50 sheets, received from the wafer conveyer chuck 15 into the processing tank 30 and carries the processed wafers W to transfer them back again to the wafer conveyer chuck 15.

Moreover, although FIG. 2 shows the first and the second processing units 11a, 11b as described above, in the third processing unit 11c, the chemical liquid B is substituted for liquid A; the chemical liquid A is substituted for the chemical liquid C; the chemical liquid tank B1 is substituted by the chemical liquid tank A1; and the chemical liquid tank Al is substituted for the chemical liquid tank C1. Also, in the fourth processing unit 11d, the chemical liquid C is substituted for the chemical liquid A; the chemical liquid B is substituted for the chemical liquid C; the chemical liquid tank C1 is substituted for the chemical liquid tank A1; and the chemical liquid tank B1 is substituted for the chemical liquid tank C1. In addition, in the rinse-and-dry processing unit 13, the rising liquid R is substituted for the chemical liquid A; the chemical liquid C is removed; the pure water source R1 is substituted for the chemical liquid tank A1; and the chemical liquid tank C1 is removed.

In the cleaning processing apparatus 3 which is structured as described above, wafers W are successively loaded into the processing units 11a–11d by the wafer conveyer chuck 15 in an order selected based on processing sequences, and the processed wafers W are unloaded from each unit 11a–11d through the rinse-and-dry processing unit 13.

Accordingly, in a case that three wafers W whose processing recipes require processing with the chemical liquid A are successively introduced, processing can be made successively without engendering any waiting time as a result of processing the first wafer W in the first processing unit 11a, the second wafer W in the second processing unit 11b and the third wafer W in the third processing unit 11c. Processing can be made successively also in a case that three wafers W whose processing recipes require processing with the chemical liquid C are successively introduced. Also, for wafers W that require processing with the chemical liquid B, processing can be made successively without engendering any waiting time when two wafers W are successively introduced.

In a case that three wafers W whose processing recipes require processing with the chemical liquid B are introduced, a waiting time is occurs for processing the third wafer W. However, processing of the first wafers W has far progressed when the third wafer W stands by. Thus, even if the third wafer W has a waiting time, it can be shortened enough. Also, for wafers W that are processed with the chemical liquid A or the chemical liquid C, in a case that four wafers are successively loaded, a waiting time occurred for processing the fourth wafer, but the waiting time can be further shortened. Accordingly, cleaning efficiency of wafers W can be improved. In other words, a number of wafers W which can be processed per a unit of time can be increased. The so-called throughput can be improved.

Additionally, when processing recipes of a plurality of wafers W are input, the CPU 40, as a controller, chooses processing units into which the wafers W "being judged" are introduced, so as to cut down a whole processing time as short as possible as described above.

What has been described above is aimed at cases of recipes using one kind of a chemical liquid. However, even in a case that processing recipes require various chemical liquids, even when two wafers W are successively loaded, the wafers W can also be successively processed respectively by the first and the second processing units, if the chemical liquids are a combination of chemical liquids A and C.

Also, since the processing unit which processes a preceding wafer W is chosen among the processing units available so as to enable the following wafers W to be processed successively. For example, when the first processing unit 11a and the third processing unit 11c are available, either the first or the third processing unit 11a or 11b is chosen for the preceding wafer W which are to be processed with the chemical liquid A, in consideration of processing recipes of the following wafers W. That is to say, if the recipes of the following wafers W require only a chemical liquid B or chemical liquids A and B, the first processing unit 11a is chosen for the preceding wafer W, so as to enable the following wafers W to be processed by the third processing unit. Accordingly, cleaning efficiency of the wafers W can be improved even in a case that the wafers W whose recipes require a combination of more than two chemical liquids are loaded.

Then the wafers W which are processed with the chemical liquids A–C are finally rinsed and dried by the rinse-and-dry processing unit 13. Consequently, the preceding chemical liquids cause no trouble even in a case that the wafers W are further processed with chemical liquids A–C and others. Also, although only one rinse-and-dry processing unit 13 is installed corresponding to four processing units 11a–11d, rinsing and drying processing causes no waiting time because the time for the rinsing and drying processing is shorter compared to a time for the chemical liquid processing. Furthermore, the cleaning processing apparatus 3 can be miniaturized since only one rinse-and-dry processing unit 13 is installed corresponding to four processing units 11a–11d.

Moreover, since the processing tank 30 of each processing unit 11a–11d is constituted by one tank in which a chemical liquid can be replaced by another one, the processing with two kinds of chemical liquids can be completed in one processing tank 30 simply by preparing, e.g., a chemical liquid A and the chemical liquid B. Consequently, a space for the respective processing units 11a–11d can be smaller.

The above-described selection of processing units is made based on chemical liquids to be used, but the selection of processing units is not limited to the above-described selection. For example, it is possible that processing sequences of a preceding object-to-be-processed which is firstly processed is compared with a processing sequence of the following object-to-be-processed which is processed afterwards, to firstly select a processing unit for the object-to-be-processed having a larger number of processing steps, and secondly select a processing unit for the object-to-be-processed having a smaller number of processing steps. Generally, a processing time as a whole can be short if objects-to-be-processed having a large number of processing steps are processed without delay. Adoption of this choosing system has an advantage to simplify the judgment of the CPU 40.

Moreover, it is possible that a processing sequence of an object-to-be-processed which is firstly processed is compared with a processing sequence of an object-to-be-processed which is processed afterwards to firstly select a processing unit for the object-to-be-processed which requires more kinds of chemical liquids and secondly select a processing unit for the object-to-be-processed which requires less kinds of chemical liquids. Generally, a processing time as a whole is shortened when objects-to-be-processed which require more kinds of chemical liquids are processed without delay. Adoption of this choosing system has an advantage to simplify the judgment of the CPU 40.

(2) The Second Embodiment

Next, a second embodiment of the present invention will be explained with reference to FIGS. 3 and 4. The same reference numbers are assigned to constituent members common with the first embodiment to simplify their explanations. The second embodiment is different from the first embodiment mainly in that chemical liquids A, B and C are replaceable in each processing unit 11a–11d, and pure water sources R0 which positively supplies pure water as a rinsing liquid R are provided in the processing tanks of respective processing units.

Figure 3:
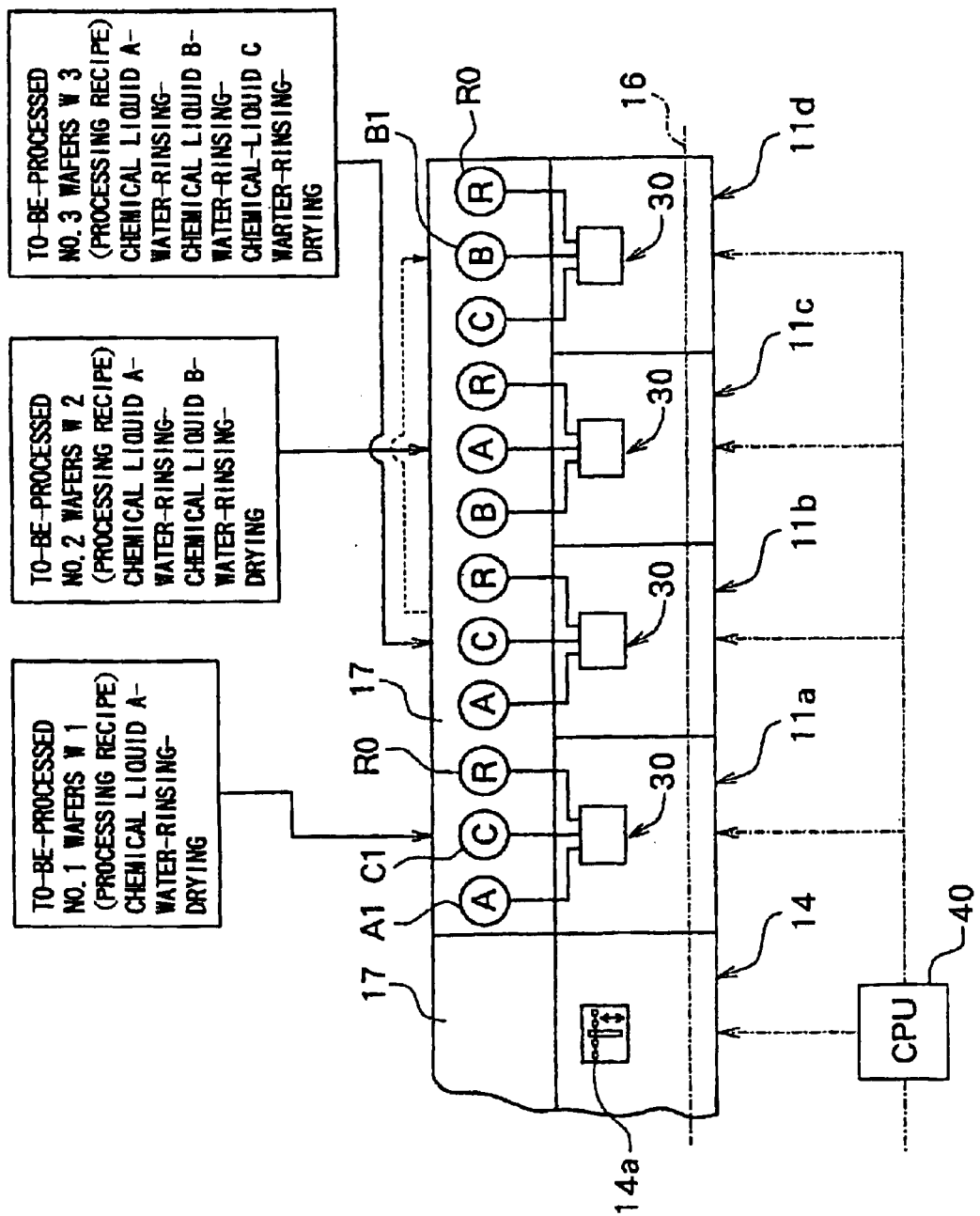
FIG. 3 is a diagrammatic plane view of the cleaning processing apparatus according to a second embodiment of the present invention.
Figure 4:
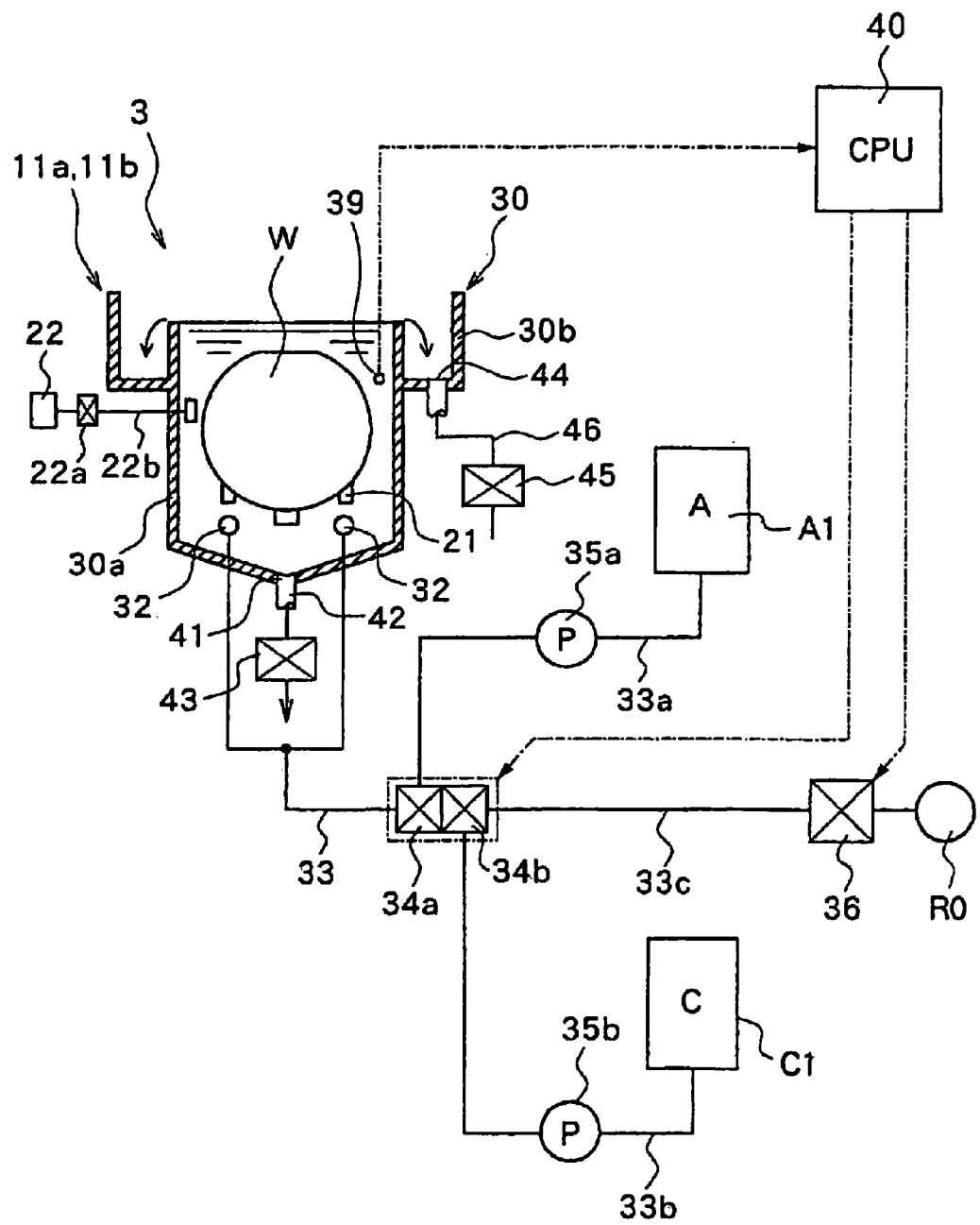
FIG. 4 is a diagrammatic sectional view of the cleaning processing apparatus.

That is to say, the pure water sources R0 are connected to the respective processing units 11a–11d as shown in FIGS. 3 and 4. In this case, each pure water source R0 is connected to a cleaning liquid supplying nozzle 32 through a main supply pipe 33 with a second change-over on-off valve 34b and a flow control valve 36 inserted in. In this case, the flow control valve 36 is an on-off valve having the flow rate control function and can completely stop the flow to the changeover on-off valve 34a and 34b in response to commands of the CPU 40 and also can admit a prescribed flow rate of a rinsing liquid R (pure water) to the change-over on-off valve 34a and 34b. That is to say, as a result of controlling a flow rate of the rinsing liquid R (pure water) by the flow control valve 36, a chemical liquid A supplied from the chemical liquid tank A1 and a chemical liquid C supplied from a chemical liquid tank C1 can be diluted to a prescribed value., as explained by the first and the second processing units 11a and 11b exemplified in FIG. 4.

In addition, in the same way as in the first embodiment described above, the first change-over on-off valve 34a is connected to the chemical liquid tank A1 through the first branch pipe 33a with the first pump 35a inserted in. Also, the second change-over on-off valve 34b is connected to the chemical tank C1 through the second branch pipe 33b with the second pump 35b inserted in.

Moreover, outside the upper part of the processing tank 30, a resistivity meter 22 for measuring a resistivity of the pure water in the inner tank 30a of the processing tank 30 is connected to the inner tank 30a through a guiding pipe 22b with a valve 22a inserted in. For the resistivity meter 22, the valve 22a is closed while chemical liquids A–C are supplied in the processing tank 30.

In the cleaning processing apparatus 3 structured as described above, as exemplified in FIG. 3, when wafers W No. 1, wafers W No. 2 and wafers W No. 3 are introduced into the cleaning processing apparatus 3 one after another, the preceding wafers W choose the processing units 11a–11b so as not to cause any waiting time for the following wafers W by considering the processing recipe of the following wafers W. In this case, the processing recipe for the wafers W No. 1 requires processing with the chemical liquid A, and then cleaning with the rinsing liquid R and drying. The processing recipe for the wafers W No. 2 requires processing with the chemical liquid A, and then cleaning with the rinsing liquid R, and further processing with the chemical liquid B, and then cleaning with the rinsing liquid R and drying. The processing recipe for the wafers W No. 3 requires processing with the chemical liquid A, and then cleaning with the rinsing liquid R, and further processing with the chemical liquid B, and then cleaning with the rinsing liquid R, and further processing with the chemical liquid C, and then cleaning with the rinsing liquid R and drying.

Firstly, upon processing the wafers W No. 1 with the chemical liquid A, if the third processing unit 11 C is chosen, the following wafers W No. 2 would have to stand by. Therefore, the wafers W No. 1 are processed by the first or the second processing unit 11a or 11b. This embodiment shows an example of processing by the first processing unit 11a which is placed at a shortest distance for the wafer chuck 15 to convey over. Consequently, the wafers W No. 2 can be introduced into the third processing unit 11c without causing a waiting time after the wafers W No. 1 are introduced into the first processing unit 11a. Furthermore, the wafers W No. 3 can be introduced into the second processing unit 11b and start to be processed without standing by. At this point, although the wafers W No. 3 are transferred to the fourth processing unit 11d for their processing with the chemical liquid B and C, no waiting time is caused. Accordingly, cleaning efficiency of wafers W can be improved.

Moreover, since the rinsing liquid R in the processing tank 30 can be replaced, processing with chemical liquids A–C and cleaning with the rinsing liquid R can be successively completed by supplying the rinsing liquid R after discharging chemical liquids A–C. Accordingly, cleaning efficiency of wafers W can be improved. Moreover, since the apparatus simply requires a rinsing liquid R to be supplied to one processing tank 30, it is not necessary to install an additional rinsing tank for cleaning with the rinsing liquid R, and as a result, the installation space and cost can be reduced.

In addition, although the first processing unit 11a and the second processing unit 11b have the same composition in the first and the second embodiments described above, either of these processing units 11a, 11b can be removed. Also, the chemical liquid tank C1 for the chemical liquid C can be omitted, and only the chemical liquid tank A1 can be left, in either one, e.g., the first processing unit 11a.

Moreover, in the first and the second embodiments described above, when any processing unit of the processing units 11a–11d is left unused for a long while, it is preferable to remove the unused processing unit from the processing unit to control. In other words, preferably it is made possible to intentionally omit a specific unused processing unit from the control for replacement and replenishment of chemical liquids A–C and a rinsing liquid R for the processing tank 30, and the alarming control.

Figure 5:
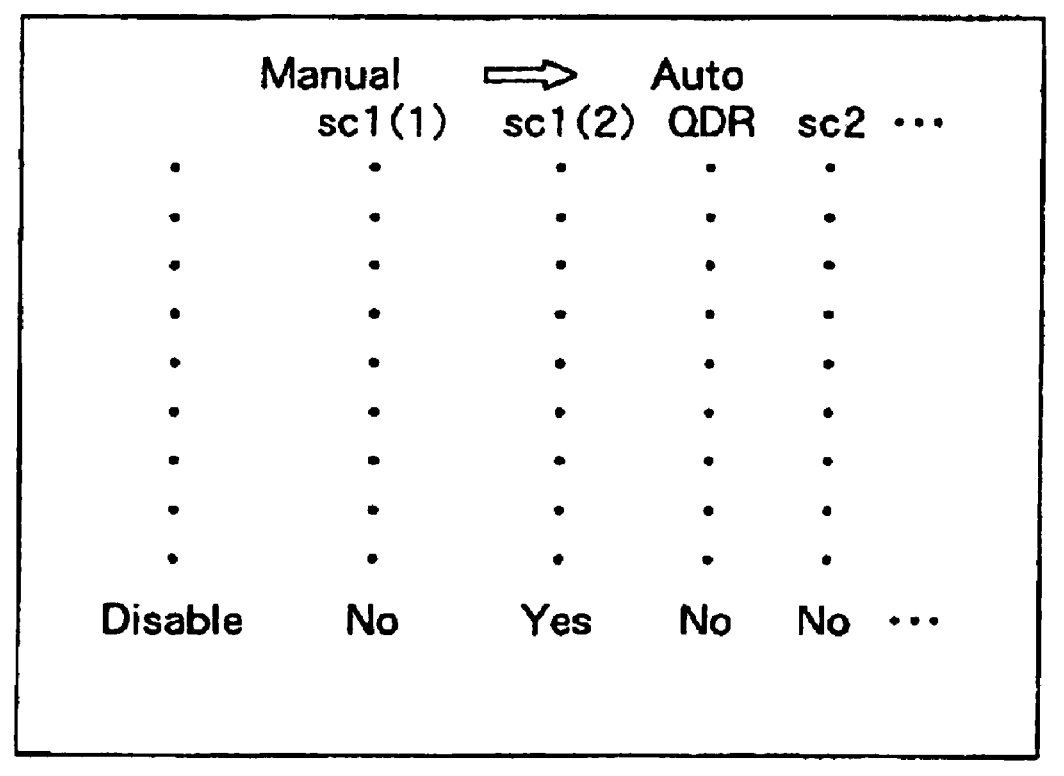

More specifically, after the basic setups and testing in the manual mode and before entering an automatic mode, the unused processing unit is programmed "Disable." This setup is arranged, as indicated in FIG. 5 for example, by choosing "Yes" on "Disable" for scl(2), for example, on the monitor display, which corresponds to the specific processing tank 30. In this way, by setting "Disable" for a processing tank 30 of the specific processing unit, (a) the lot of the wafers W of a processing recipe requiring processing in said processing tank 30 [scl(2) in FIG. 5] is not accepted and is omitted before or at the point of introduction into the cleaning processing system, (b) even if the replacement and replenishment conditions of chemical liquids A–C and a rinsing liquid R are programmed for said processing tank 30, the replacement etc. are not executed, (c) as for new wafers W, even if the alarm is made for the processing unit including said processing unit 30, introduction of every lot to the processing units, except for the processing unit which is set "Disable", is continued without prohibition. However, an interlock is programmed as usual to improve safety by alarm at the processing units which are not programmed "Disable".

By the above-described structure, cost reduction can be achieved since unnecessary replacement and replenishment of chemical liquids A–C and a rinsing liquid R are circumvented and there is no need to change the conditions of replacement and replenishment of chemical liquid A–C, etc. Also, even if the alarm is made for the processing unit which is programmed "Disable", processing by the other processing units are not discontinued, and throughput can be improved.

Needless to say, in the above-described embodiments, the cleaning processing method and the cleaning processing apparatus according to the present invention are applied to a cleaning processing system for semiconductor wafers but are applicable to the cleaning processing for, e.g., substrates for LCD's besides wafers.

As described above, the following outstanding effects are achieved by the present invention owing to the above-described structure.

(i) Since a plurality of processing liquids are provided for each processing unit, and furthermore the same kind of a processing liquid is provided for at least two processing units, the system includes the first processing unit providing a processing liquid A and the third processing unit providing a processing liquid A and processing liquid B. Consequently, in a case that two objects-to-be-processed whose processing sequences require processing with a processing liquid A are consecutively introduced, the object-to-be-processed which is to be firstly processed is processed by the first processing unit, and successively the object-to-be-processed which is to be processed afterwards is processed by the third processing unit. That is to say, no waiting time is caused even when two objects-to-be-processed having the same processing sequence are consecutively introduced for the processing.

Likewise, by providing the same processing liquid for three or more processing units, the objects-to-be-processed can be processed successively even when three objects-to-be-processed having the same processing sequence are consecutively introduced. However, even in a case that the same processing liquid is provided for only two processing units, the time for the third object-to-be-processed to stand by can be shortened enough since processing of the first object-to-be-processed has been far progressed by the time when the third object-to-be-processed is processed. Accordingly, cleaning efficiency of objects-to-be-processed can be improved.

(ii) According to the present invention, a processing unit for processing an object-to-be-processed which is to be firstly processed is chosen among a plurality of processing units so that processing of an object-to-be-processed which is to be processed afterwards can be successively made; therefore, in a case, for example, that the first processing unit providing a processing liquid A and the third processing unit providing a processing liquid A and a processing liquid B are available, either the first or the third processing unit is chosen for the object-to-be-processed which requires processing only with a processing liquid A and which is to be firstly processed, in consideration of a processing sequence of the object-to-be-processed which is to be processed afterwards. That is to say, if an object-to-be-processed which is to be processed afterwards has a processing sequence requiring processing only with a processing liquid B, or processing with both processing liquids A and B, the object-to-be-processed which is to be processed afterwards can be processed by the third processing unit by choosing the first processing unit for an object-to-be-processed which is to be firstly processed. Thus, cleaning efficiency of objects-to-be-processed can be further improved since processing of an object-to-be-processed which is firstly processed less hinders processing of an object-to-be-processed which is processed afterwards.

(iii) According to the present invention, a processing liquid staying on an object-to-be-processed after processed in one processing unit is washed off and then the object-to-be-processed is dried; therefore, a processing liquid which is used for previous processing causes no harmful effect even in a case that different processing liquids are used one after another for an object-to-be-processed.

(iv) According to the present invention, only one rinse-and-dry processing unit is installed corresponding to a specific number of processing units, rinsing and drying processing causes no waiting time because a time for rinsing and drying processing is shorter compared to a time for processing with processing liquids. Furthermore, the installation space for the rinsing and drying processing unit can be reduced and the system can be miniaturized since only one rinse-and-dry processing unit is installed corresponding to a plurality of processing units.

(v) According to the present invention, chemical liquids are replaceable in one tank of each processing unit; therefore, processing with two kinds of processing liquids can be completed one after another in one processing tank if a processing liquid A and a processing liquid B are only provided, for instance. Consequently, reduction of installation space for each processing unit can be achieved.

(vi) According to the present invention, a rinsing liquid can be replaceable in one tank; therefore, processing with processing liquids and cleaning with a rinsing liquid can be successively completed in one tank by supplying a rinsing liquid after discharging the processing liquids. Accordingly, cleaning efficiency of objects-to-be-processed can be improved. Moreover, the apparatus simply requires a rinsing liquid to be supplied to one processing tank, the installation space and cost can be reduced compared to a case of installing another rinsing unit.

What is claimed is:

1. A cleaning processing apparatus comprising:

a plurality of processing units for processing an object to be processed with a plurality of kinds of processing liquids, the same kind of a processing liquid being capable of being supplied to at least two of the plurality of processing units; and a controller for, upon successively introducing objects to be processed each having its own processing sequence into a plurality of processing units, checking the processing sequence of the object to be processed afterwards to choose one or more processing units into which the object to be processed afterwards is carried, and then choose one or more processing units into which the object to be firstly processed is carried out of the processing units excluding said one or more processing units which have been already chosen, so as to shorten a whole processing time of the objects to be processed being judged.

2. A cleaning processing apparatus comprising:

a plurality of processing units for processing an object to be processed with a plurality of kinds of processing liquids, the same kind of a processing liquid being capable of being supplied to at least two of the plurality of processing units; and a controller for, upon successively introducing objects to be processed each having its own processing sequence into a plurality of processing units, checking the processing sequence of the object to be processed afterwards and comparing the processing sequence of the object to be firstly processed with the processing sequence of the object to be processed afterwards to firstly choose one or more processing units into which the object to be processed having more processing steps is carried, and then choose one or more processing units into which the object to be processed having less processing steps is carried so as to shorten a whole processing time of the objects to be processed being judged.

3. A cleaning processing apparatus comprising:

a plurality of processing units for processing an object to be processed with a plurality of kinds of processing liquids, the same kind of a processing liquid being capable of being supplied to at least two of the plurality of processing units; and a controller for, upon successively introducing objects to be processed each having its own processing sequence into a plurality of processing units, checking the processing sequence of the object to be processed afterwards and comparing the processing sequence of the object to be firstly processed with the processing sequence of the object to be processed afterwards to firstly choose one or more processing units into which the object to be processed requiring more kinds of chemical liquids is carried, and then choose one or more processing units into which the object to be processed requiring less kinds of chemical liquids is carried so as to shorten a whole processing time of the objects to be processed being judged.

4. A cleaning processing apparatus comprising:

a plurality of processing units for processing an object to be processed with a plurality of kinds of processing liquids, the same kind of a processing liquid being capable of being supplied to at least two of the plurality of processing units; and a controller for, upon successively introducing objects to be processed each having its own processing sequence into a plurality of processing units, checking the processing sequence of the object to be processed afterwards to choose one or more of the plurality of the processing units into which an object to be firstly processed is carried so that a whole processing time of the objects to be processed being judged can be shortened, wherein chemical liquids are replaceable in one processing tank of each processing unit, in which the objects to be processed are processed.

5. The cleaning processing system according to claim 4 wherein:

chemical liquids can be replaced by a rinsing liquid in one processing tank of each processing unit, in which the objects-to-be-processed are processed.

* * * * *